(12) United States Patent
Killig et al.

(10) Patent No.: US 6,304,947 B1
(45) Date of Patent: Oct. 16, 2001

(54) OPTIMIZED MEMORY ORGANIZATION IN A MULTI-CHANNEL ARCHITECTURE

(75) Inventors: Ralf Killig, Grafenau; Thomas Henkel, Boeblingen, both of (DE)

(73) Assignee: Agilent Technologies, Inc., Loveland, CO (US)

( * ) Notice: Subject to any disclaimer, the term of this patent is extended or adjusted under 35 U.S.C. 154(b) by 0 days.

(21) Appl. No.: 09/140,427

(22) Filed: Aug. 26, 1998

(30) Foreign Application Priority Data

Sep. 13, 1997 (EP) .................................................. 97115981

(51) Int. Cl.⁷ ..................................................... G06F 12/00
(52) U.S. Cl. ......................... 711/154; 711/170; 711/171; 711/172; 711/165; 710/57; 710/127
(58) Field of Search ..................................... 711/141, 154, 711/170–172, 165; 710/57, 127

(56) References Cited

U.S. PATENT DOCUMENTS 5,781,918 * 7/1998 Lieberman et al. ...................... 711/5

OTHER PUBLICATIONS

Electronics International, vol. 54, No. 22, Nov. (1981), pp. 122–127, Garry C. Gillette, "Tester Takes on VLSI with 264–K Vectors Behind its Pins".

IEEE Design & Test of Computers, vol. 2, No. 6, Dec. (1985), pp. 57–62, Wayne Ponik, "Teradyne's J967 VKSU Test System: Getting VLSI to the Market on Time".

* cited by examiner

Primary Examiner—Matthew Kim
Assistant Examiner—Pierre M. Vital

(57) ABSTRACT

Described is a computer system having a multi-channel architecture wherein a plurality of individual channels, each having a respective channel memory and being connected by a bus. According to the invention, loading data, and preferably sequential data, into a channel memory of one of the plurality of individual channels is accomplished by (a) loading data into the channel memory to be loaded; (b) distributing further data which is to be loaded into the channel memory to be loaded into another channel memory of another one of the plurality of individual channels; and (c) reloading the data from the channel memory of the other one of the plurality of individual channels to the channel memory to be loaded via the bus. The invention is preferably used in a testing system, such as an IC tester.

3 Claims, 4 Drawing Sheets

OPTIMIZED MEMORY ORGANIZATION IN A MULTI-CHANNEL ARCHITECTURE

BACKGROUND OF THE INVENTION

The present invention generally relates to the memory organization in computer systems with a multi-channel architecture.

FIG. 1 shows a principal arrangement of a computer system 10 with a multi-channel architecture. The computer system 10 comprises a main computer 20 for controlling the computer system 10, a data storage 30, and a plurality of individual channels 40AA, . . . , 40ZZ. Each one of the plurality of individual channels 40AA, . . . , 40ZZ comprises an individual channel memory 50AA, . . . , 50ZZ, and is connected via a system bus 60 to a controller 70 for controlling the plurality of individual channels 40AA, . . . , 40ZZ. It is to be understood that the controller 70 can also be part of the main computer 20, however for the sake of a better understanding, is referred herein as an individual element.

The multi-channel architecture distinguishes from other computer architectures in that the architecture of the computer system 10 allows a functioning of each one of the plurality of individual channels 40AA, . . . , 40ZZ independent of the other channels 40AA, . . . , 40ZZ.

Each one of the plurality of individual channels 40AA, . . . , 40ZZ might comprise an individual processing unit and therefore represent an 'intelligent' channel. The main computer 20 represents a 'central intelligence' of the computer system 10 and may control the plurality of individual channels 40AA, . . . , 40ZZ to a certain extent by means of the controller 70.

The data storage 30 can be any storage as known in the art, however, in most cases represents a 'central storage' of the computer system 10 and is therefore in general a slower but larger storage medium than the 'decentralized' channel memories 50AA, . . . , 50ZZ. The data storage 30 normally is a disk storage, whereas the channel memories 50AA, . . . , 50ZZ might be silicon memories such as a RAM (random access memory), a DRAM (dynamic random access memory), or an SDRAM (synchronous dynamic random access memory).

It is also to be understood, that the computer system 10 may also comprise a plurality of individual channels without respective channel memories. However, since those channels make no contribution to the memory organization in the multi-channel architecture, they are disregarded herein for the sake of simplicity.

The plurality of individual channels 40AA, . . . , 40ZZ can be connected with inputs and/or outputs of other devices and provide data thereto and/or receive data therefrom. However, since those devices also make no contribution to the memory organization in the multi-channel architecture, they are accordingly disregarded herein for the sake of simplicity.

FIG. 2 shows a principal arrangement of another embodiment of the computer system 10 with a multi-channel architecture. The arrangement of FIG. 2 differs from the arrangement of FIG. 1 in that one or more of the plurality of individual channels 40AA, . . . , 40ZZ according to FIG. 1 might be physically arranged on one or more channel boards 100A, . . . , 100Z. In the example of FIG. 2, channel board 100A contains channels 40AA, . . . , 40AZ, and channel board 10OZ contains channels 40ZA, . . . , 40ZZ. It is clear that the actual arrangement of the channels 40AA, . . . , 40ZZ and channel boards 100A, . . . , 100Z depends on the actual application.

The channels 40AA, . . . , 40ZZ are connected within the respective channel boards 100A, . . . , 100Z via a respective channel board bus 110A, . . . , 100Z, which also provides a connection with the system bus 60. In the example of FIG. 2, the channels 40AA, . . . , 40AZ are connected within the channel board 100A and to the system bus 60 via channel board bus 110A, and the channels 40ZA, . . . , 40ZZ are connected within the channel board 100Z and to the system bus 60 via channel board bus 110Z.

The system bus 60 and the channel board busses 110A, . . . , 110Z are generally embodied as relatively high speed busses, especially in comparison to the connection between the main computer 20 and the controller 70. The system bus 60 and the channel board busses 110A, . . . , 110Z can be physically and electrically separated by suitable means as known in the art, and are generally controlled by the controller 70.

An important application of the multi-channel architecture is in testing applications, e.g. for testing integrated circuits (IC's) or other electronic devices, such as the Hewlett-Packard HP 83000 Digital IC Test Systems. A typical testing unit comprises a tester circuit and a device under test (DUT), which can be an IC or any other electronic device. The tester circuit generally comprises a signal generating unit for generating and applying a stream of stimulus data to the DUT, a signal receiving unit for receiving a response on the stream of stimulus data from the DUT, and a signal analyzing unit for comparing the response with an expected data stream. Test data applied to the DUT is also called vector data or test vector and comprises one or more single individual vectors. Each individual vector may represent a signal state which is either to be applied at one or more inputs of the DUT or output by the DUT, at a given point in time.

A specific tester architecture following the multi-channel architecture of FIG. 1 is the so-called tester-per-pin or test-processor-per-pin architecture, wherein one of the plurality of individual channels 40AA, . . . , 40ZZ is provided for each testable pin of the DUT. The tester-per-pin architecture can be applied in a mono-site architecture, wherein only one DUT can be tested at once, or in a multi-site architecture, wherein a plurality of DUTs can be tested simultaneously and in parallel.

There are several testing methods known in the art to apply test data to the DUT. In a so called 'parallel test', the DUT input signal is applied at the inputs of the DUT and the outputs thereof are observed. During a SCAN test, states internal of the DUT can be sequentially changed and/or monitored directly. DUTs that allow SCAN test normally need special storage devices which can be written or read in a serial fashion. Boundary SCAN test is often used during a board test to directly change and monitor certain states at the boundaries of the DUTs on a board.

In certain applications of the computer system 10, such as testing applications, it might be required that one or more channels of the plurality of individual channels 40AA, . . . , 40ZZ provide a data stream, e.g. of sequential data, which should be preferably without interrupts. In that case, the respective one(s) of the channel memories 50AA, . . . , 50ZZ are loaded, e.g. sequentially, with a certain amount of data, which then again is output by the respective channel, e.g. to the DUT. It is apparent, that each (re-)loading of the channel memories 50AA, . . . , 50ZZ represents an interruption of the data stream which can be applied from one channel. However, it is also clear that a continuous loading or re-loading of data from the data storage 30 to the channel memories 50AA, . . . , 50ZZ of the individual channels 40AA, . . . , 40ZZ is generally impossible due to a different access speed to the data storage 30 and to the channel memories 50AA, . . . , 50ZZ. Further more, the connection between the main computer 20 and the controller 70 might also represent a 'bottle-neck' in the data transfer from the data storage 30 to the channel memories 50AA, . . . , 50ZZ.

In other applications, it might (further) be required that the system bus 60 is used—to a certain period in time—only either for writing or for reading purposes at once. This might particularly be important due to noise reasons in testing applications, since the signals on the system bus 60 can influence the testing results. It is apparent that in those applications, a loading or (re-)loading of the channel memories 50AA, . . . , 50ZZ cannot be performed continuously or in parallel, e.g. for a processing or data output of the channel(s) 40AA, . . . , 40ZZ, and should be reduced to a minimum.

In operation, when the channel memories 50AA, . . . , 50ZZ are to be loaded with data, the main computer 20 receives the data to be loaded, e.g. from the data storage 30, and instructs the controller 70 to carry out the loading of the individual channel memories 50AA, . . . , 50ZZ. Accordingly, when a certain data is to be loaded form any one of the channel memories 50AA, . . . , 50Z, the main computer 20 instructs the controller 70 to carry out the reading from the respective channel memories 50AA, . . . , 50ZZ.

It has been found that certain applications, and in particular testing such as SCAN testing, e.g. on a digital IC test system, generally require large ('deep') channel memories 50AA, . . . , 50ZZ, e.g. for sequentially storing SCAN test vectors. In the multi-channel architecture of FIG. 1 or 2, an own channel memory 50AA, . . . , 50ZZ for storing a program and/or respective data is provided for each one of the plurality of individual channels 40AA, . . . , 40ZZ. In the test-processor-per-pin-architecture in testing applications, an own channel memory 50AA, . . . , 50ZZ for storing a program and the respective test vectors must be provided for each testable pin of the DUT. However, since a high performance generally requires fast accessible and therefore expensive channel memories 50AA, . . . , 50ZZ, such as SRAMs or SDRAMs, the provided size of the channel memories 50AA, . . . , 50ZZ is typically not large enough, e.g. for an efficient SCAN testing.

There are several solutions known in the art to overcome the problem of an insufficient size of the channel memories 50AA, . . . , 50ZZ. A first possibility is to interrupt a data flow from the channel(s) 40AA, . . . , 40ZZ, e.g. during a SCAN test, when a respective one of the channel memories 50AA, . . . , 50ZZ becomes empty, and to reload data from the data storage 30 by means of the main computer 20 and the controller 70. However, this possibility generally fails for performance reasons, since the reloading of the channel memories 50AA, . . . , 50ZZ is relatively 'slow' and thus requires a certain amount of time.

A second solution is to provide a few dedicated ones of the channel(s) 40AA, . . . , 40ZZ, e.g. as SCAN test channels, each with a deep channel memory 50AA, . . . , 50ZZ with respect to other ones of the channel(s) 40AA, . . . , 40ZZ. However, this solution suffers from a restricted flexibility of the channel(s) 40AA, . . . , 40ZZ, or a reduced accuracy, e.g. for test applications. In tester applications, the connection of the channels 40AA, . . . , 40ZZ as tester channels to the DUT is usually accomplished by means of an adaptor board. A new adaptor board must therefore be provided for each different DUT with a different test pinout. Further more, the integration of a switch matrix on the adaptor board between the tester connection and the DUT limits the accuracy and reliability.

A third approach is to add a dedicated memory board into the computer system 10. The main computer 20 loads all required data, e.g. SCAN test vectors required for a test, into this memory board before an application of the data, e.g. an execution of a test. During the application of the data, the channels 40AA, . . . , 40ZZ reload data from this memory board at a significant higher speed compared to solution one. The drawbacks are additional cost for the dedicated memory board and higher complexity for the reload mechanism.

A memory organisation in a central sequencer per test system is disclosed by Garry C. Gillette: "Tester takes on VLSI with 264-K vectors behind its pins", ELECTRONIC INTERNATIONAL, vol. 54, no.22, November 1981, New York, USA, pages 122–127, XP002056405. The central sequencer per test system sends, during a test cycle, 4 addresses to all 96 channels. The addresses go to a fast x and y memory, a slow z memory and a source select memory. A source select memory controls in each test cycle which memory will drive a pin, e.g. memory X or memory Y. The four addresses are common for all channels. During a scan test in the central sequencer machine, the memory of the neighbours n+1 or n−1 can be used for applying data to channel n. In that case, however, the used channel n+1 or n−1 cannot be used individually because of the common four address busses.

It is an object of the invention to provide an improved memory organization in computer systems with a multi-channel architecture. The object is solved by the features of the independent claims.

The invention is applied in a computer system having a multi-channel architecture wherein a plurality of individual channels having a respective channel memory and being connected by a bus. According to the invention, loading data, and preferably sequential data, into a channel memory of one of the plurality of individual channels is accomplished by:

(a) loading data into the channel memory to be loaded;
(b) distributing further data which is to be loaded into the channel memory to be loaded into another channel memory of another one of the plurality of individual channels; and
(c) reloading the data from the channel memory of the other one of the plurality of individual channels to the channel memory to be loaded via the bus.

The invention allows to provide a multi-channel architecture with a high parallelism and flexibility of the plurality of individual channels and the respective channel memories. The individual channels can be built up as identical modules comprising identical parts, so that not only the manufacturing and maintaining of the modules are improved, but also the flexibility of the channels is highly increased since each channel can be used for any application and is exchangeable and not custom built for only specific applications.

A different demand that will be made upon the individual channel memories, e.g. one of the individual channel memories is to be loaded with more data than the other channel memories, is balanced by applying the distributing and reloading of data according to the invention. The size of the individual channel memories can thus be limited and need not be the maximum size maybe only required for some specific applications. This again reduces the costs of the memories and thus of the entire system.

Further more, the reloading between the channel memories dramatically reduces the loading time in comparison to a direct loading from a central resource such as a central data storage of the computer system.

The invention can be preferably used for applying sequential data to the channels. This is particularly advantageous in testing applications such as SCAN testing, wherein generally a high amount of sequential data is to be applied to only a few channels whereas the other channels only require few data with respect to those channels. According to the invention, the already available memory of all the channels can be used for distributed storing of the data. This approach allows high performance testing with best flexibility and accuracy without additional cost.

BRIEF DESCRIPTION OF THE DRAWINGS

Other objects and many of the attendant advantages of the present invention will be readily appreciated and become better understood by reference to the following detailed description when considering in connection with the accompanied drawings, in which.

DETAILED DESCRIPTION OF THE INVENTION

When data is to be loaded into one or more of the channel memories 50AA, . . . , 50Z, the main computer 20 instructs the controller 70 to execute the loading of the respective channel memories 50AA, . . . , 50ZZ. According to a first aspect of the invention and preferably in case that the storage capacity of one or more of the channel memories 50AA, . . . , 50ZZ to be loaded is not sufficient to fully load the respective channel memory, the main computer 20 instructs the controller 70 to load the respective channel memory to a certain degree and to distribute further data (which is to be loaded into that respective channel memory) into other ones of the channel memories 50AA, . . . , 50ZZ which still retain a certain free storage capacity. When the respective channel requires a certain data that is not stored into the respective channel memory but into the channel memory of another channel, the main computer 20 instructs the controller 70 to reload that certain data from the channel memory of the other channel into the channel memory of the respective channel.

In an example, wherein the amount of data to be loaded into channel memory 50AC is greater the storage capacity of the channel memory 50AC, the main computer 20 instructs the controller 70 to load the channel memory 50AC to a certain degree and to distribute further data (which is to be loaded into channel memory 50AC) to e.g. channel memories 50M and 50AB, which still retain a certain storage capacity. When the channel 40AC requires a certain data that is not stored into the channel memory 50AC but into the channel memories 50AA and/or 50AB, the main computer 20 instructs the controller 70 to reload that certain data from the channel memories 50AA and/or 50AB into the channel memory 50AC of the channel 40AC.

In order to provide the data distribution according to the first aspect, the main computer 20 controls and/or monitors the loading state of the channel memories 50AA, . . . , 50ZZ. The main computer 20 thus 'knows' the loading state and the remaining capacity of the channel memories 50AA, . . . , 50ZZ, and can distribute data required in a certain channel to the channel memory/memories of other channel(s).

Figure 1:
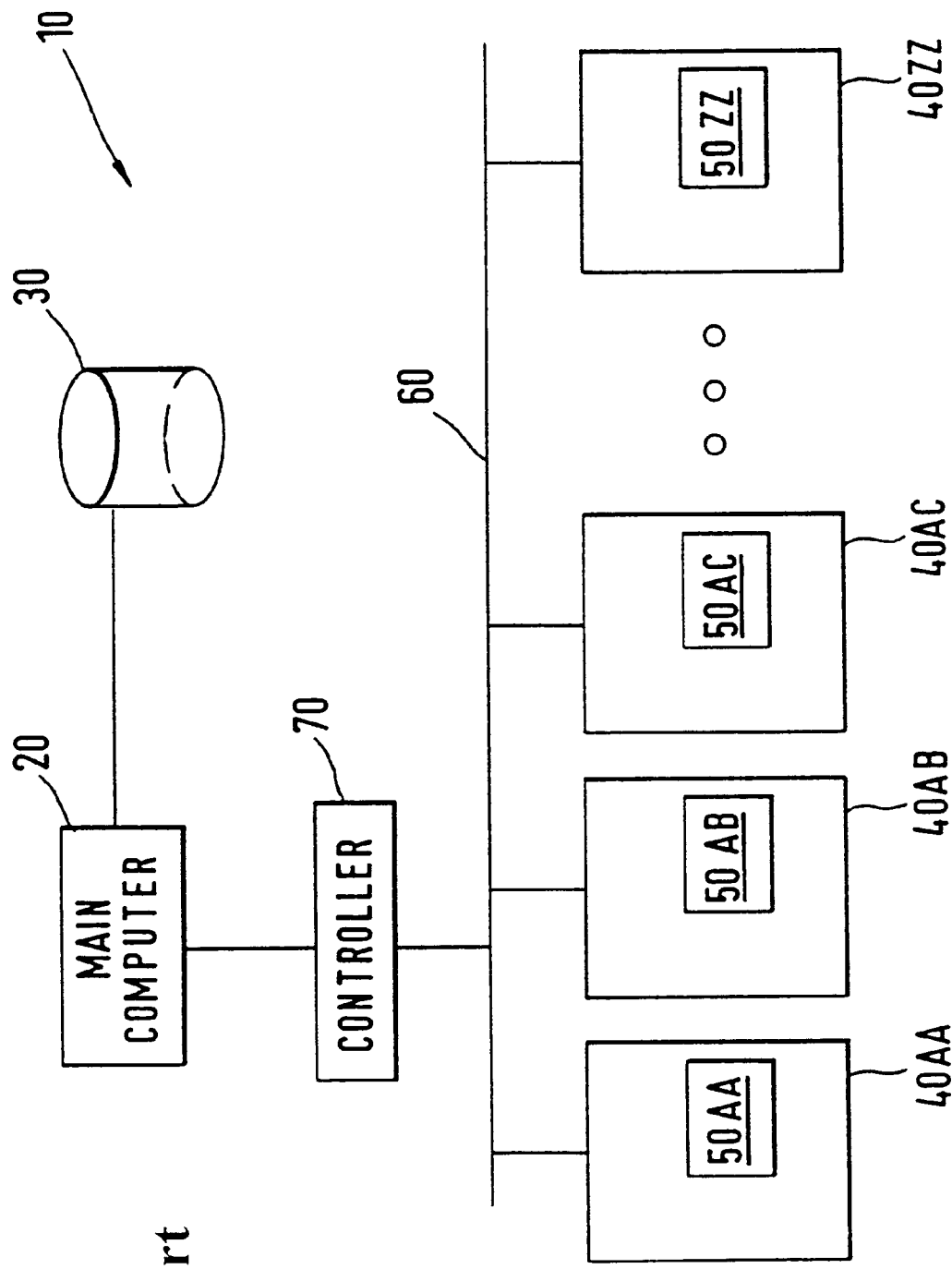
FIG. 1 shows a principal arrangement of a computer system 10 with a multi-channel architecture.
Figure 2:
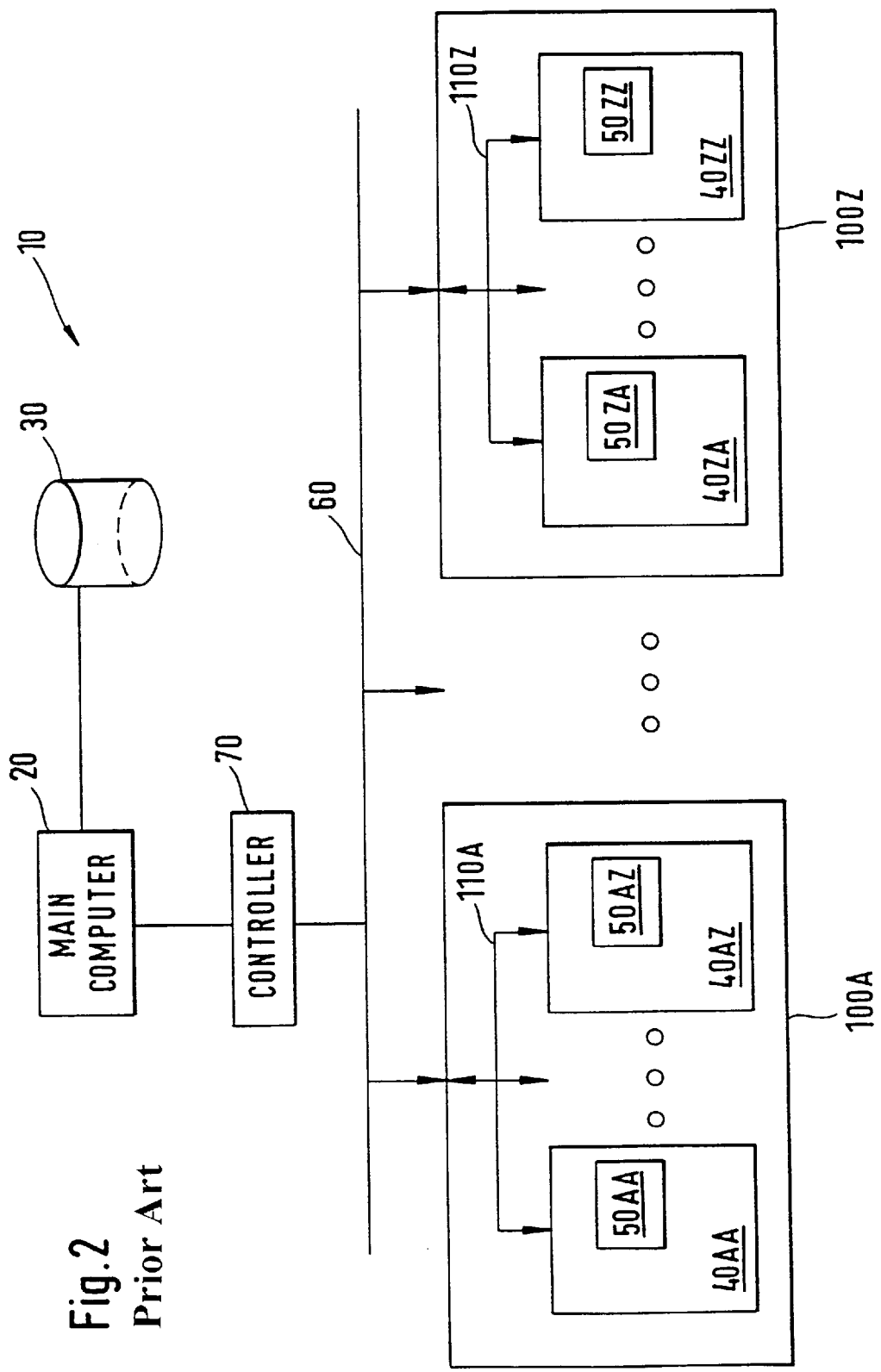
FIG. 2 shows a principal arrangement of another embodiment of the computer system 10 with a multi-channel architecture.

In the arrangement according to FIG. 2, data is preferably distributed only within one of the channel boards 100A, . . . , 100Z. This allows a high parallelism of the memory organization, since the sources and destinations of the data to be loaded are respectively located on the same channel boards. Channel memories 50AA, . . . , 50ZZ located on different ones of the channel boards 100A, . . . , 100Z and which are to be reloaded from channel memories 50AA, . . . , 50ZZ located on the same one of the channel boards 100A, . . . , 100Z can be reloaded in parallel in case that the respective channel board busses 110A, . . . , 110Z are electrically separated from the system bus 60, so that the respective data to be loaded is only applied on the respective one of the channel board busses 110A, . . . , 100Z.

According to a second aspect of the invention, when data is to be reloaded from one of the channel memories 50AA, . . . , 50ZZ to another one, the reloading is executed in a so-called "Treat-as-Write Mode". Instead of reading the data to be reloaded from the reloading channel memory and then writing that data to the channel memory to be reloaded, the main computer 20 instructs the channel memory to be reloaded to enter into the Treat-as-Write Mode. In the Treat-as-Write Mode, the read transactions on the system bus 60 and/or the respective channel board bus 110A, . . . ,110Z are treated as write transactions for the channel memory to be reloaded. Hence data from the reloading channel memory can be transferred to the channel memory to be reloaded at high speed without significant additional complexity inside the channels or on the channel boards. No special state machines or direct memory access (DMA) controllers are needed on the channel boards 100A, . . , 100Z or in the channels 40AA, . . . , 40ZZ since each of the bus connections is already in place and the transfer can be controlled centrally by the controller 70. Only the controller 70 needs to know about where the data is coming from and going to and how many accesses need to be executed. The controller 70 receives this information from the main computer 20 and then performs the reloading by itself.

In the above example, wherein data is to be reloaded from the channel memories 50AA and/or 50AB to the channel memory 50AC, the main computer instructs the channel memory 50AC to enter into the Treat-as-Write Mode. The main computer 20 instructs the controller 70 to read from the channel memories 50AA and/or 50AB, so that one of the channel memories 50AA or 50AB places the requested data to be read onto the system bus 60. The channel memory 50AC treats that read transaction as a write transaction and thus stores the requested data applied on the system bus 60.

In order to avoid synchronization problems between the reloading channel and the channel to be reloaded during the application of the Treat-as-Write Mode, the treatment of a read transaction as a write transaction is preferably executed in a so-called "Delayed Write Mode". In the Delayed Write Mode, the start of the writing of the requested data is delayed to a certain extent with respect to start of the reading transaction.

Figure 3:
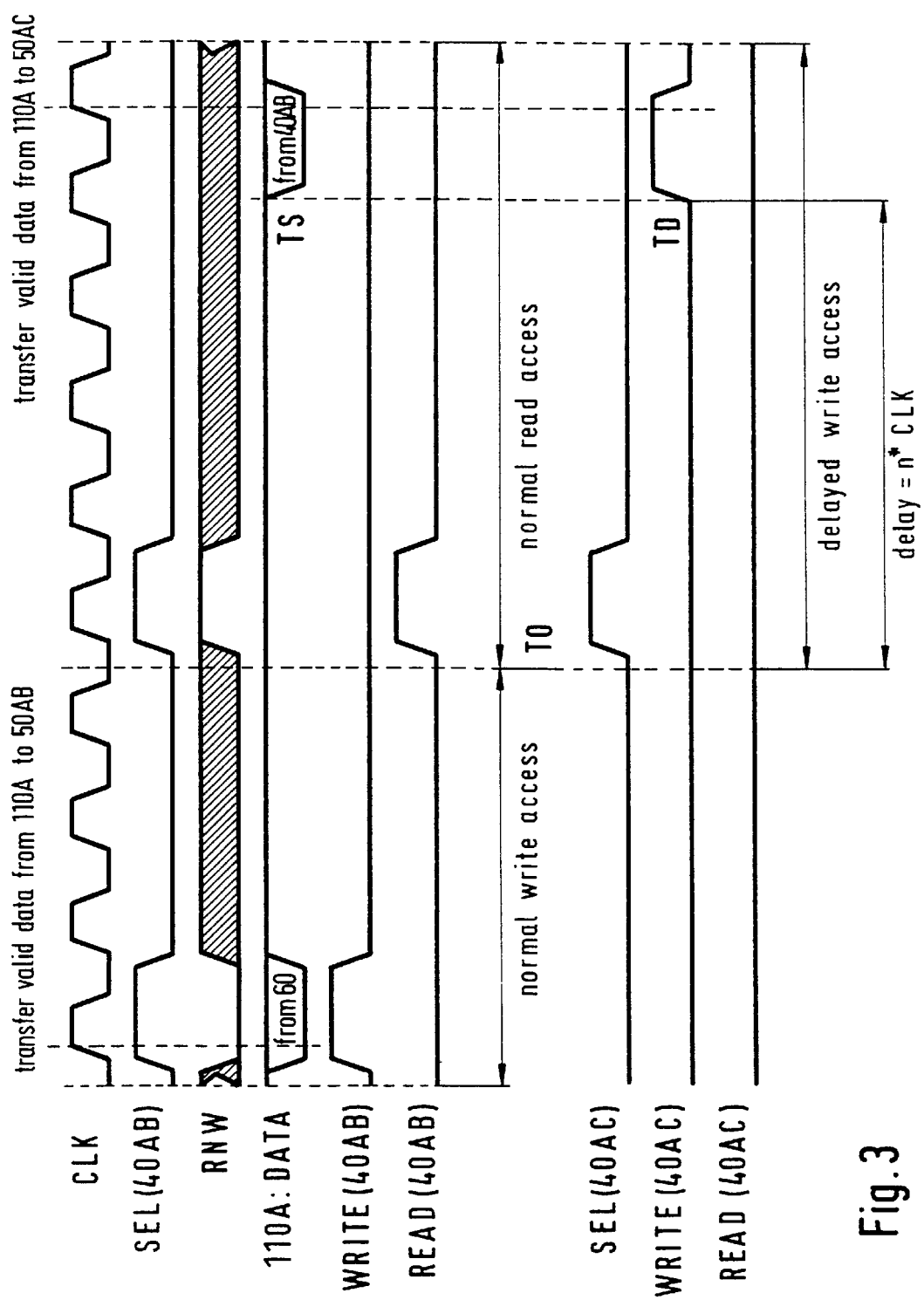
FIG. 3 shows an example of a timing diagram of the Delayed Write Mode.
Figure 4:
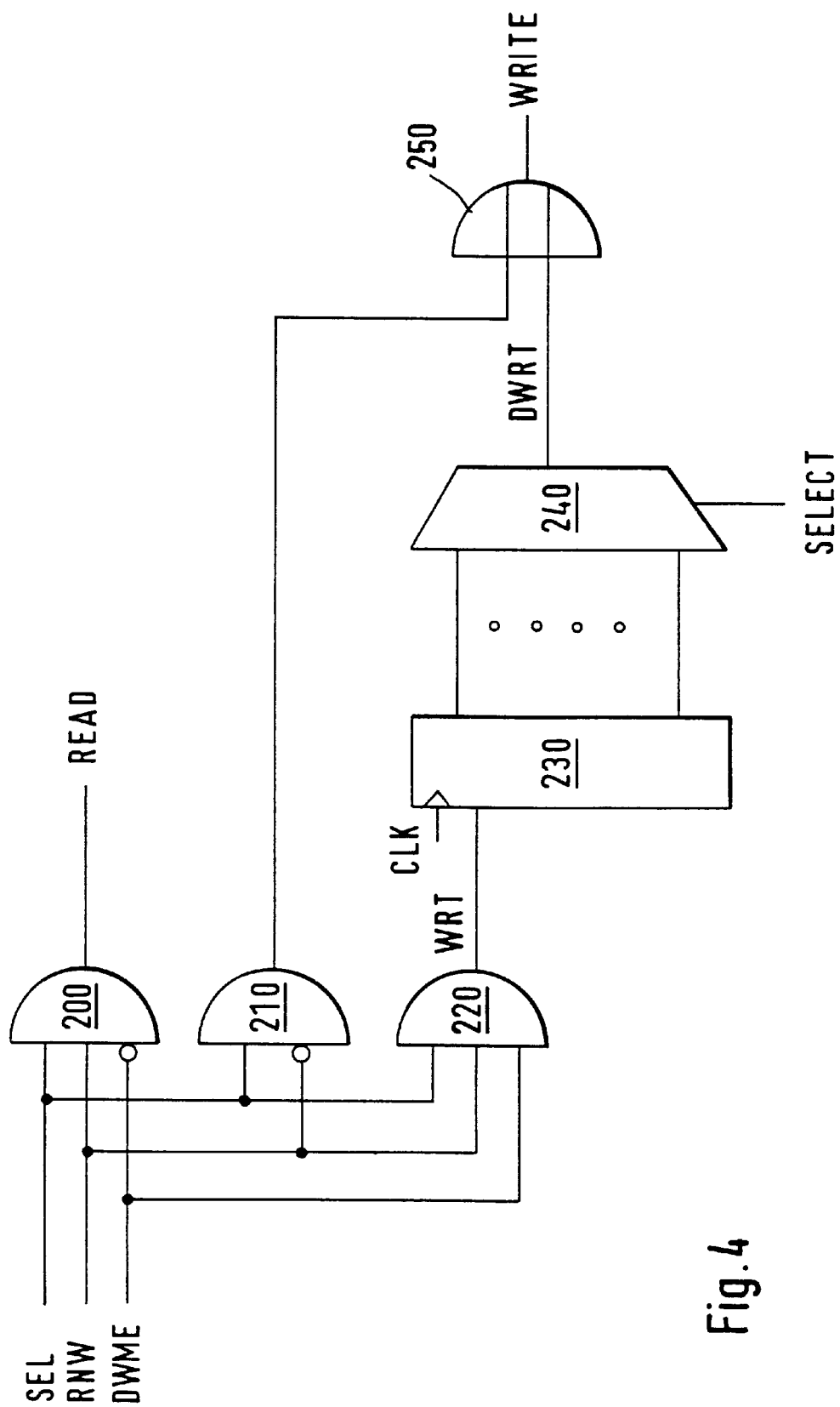
FIG. 4 depicts an embodiment for implementing the Delayed Write Mode.

FIG. 3 shows a timing diagram explaining the Delayed Write Mode for the above example, wherein the channel memory 50AC is to be reloaded from channel memory 50AB. FIG. 4 depicts an embodiment for implementing the Delayed Write Mode. The embodiment of FIG. 4 may be implemented for each one of the channels 40AA, ..., 40ZZ, or at least for those channels which might require the Delayed Write Mode.

The computer system 10 is synchronized with a central clock CLK. At a certain time T0, each channel 40*ii* receives by a respective gate 200, e.g. an AND gate, a channel signal SEL, a read/write signal RNW, and a Delayed Write Mode Enable signal DWME. The respective gate 200 generates therefrom a respective signal READ for that channel 40ii indicating whether this channel 40*ii* is requested to place a certain data on the system bus 60 or the respective channel board bus 110A, ..., 110Z. In the above example, the channel 40AB (with the requested data) receives a valid channel signal SEL, a valid read/write signal RNW, and a disabled Delayed Write Mode Enable signal DWME, and the respective gate 200 generates therefrom a valid signal READ for that channel 40AB. This causes the channel 40AB to place a requested data signal DATA onto the system bus 60 through the channel board bus 110A. However, due to internal delay times, the data signal DATA will be valid first after an internal delay time TS with respect toe T0.

Simultaneously, the channel 40AC (which requests the data DATA) also receives a valid channel signal SEL and a valid read/write signal RNW, but an enabled Delayed Write Mode Enable signal DWME, so that the respective gate 200 does not generate therefrom a valid signal READ for the channel 40AC. However, since the Delayed Write Mode Enable signal DWME is enabled for the channel 40AC, the channel 40AC generates by means of a gate 220, e.g. an AND gate, from the valid channel signal SEL, the valid read/write signal RNW, and the enabled Delayed Write Mode Enable signal DWME a valid signal WRT which is then sampled by a shift register 230 clocked by the signal CLK. One of the outputs of the shift register 230 is selected by a multiplexor 240 by means of a select signal SELECT as a delayed write signal DWRT. Each one of the stages of the shift register 230 delays the incoming signal WRT by an additional cycle of the clock signal CLK. The select signal SELECT controls the delay of the generated delayed write signal DWRT by selecting the output of the appropriate stage of the shift register 230.

The delayed write signal DWRT at the output of the multiplexor 240 is then combined by a gate 250, e.g. and OR gate, with an output of a gate 210, e.g. an AND gate. The combination of the output of a gate 210, which becomes active for normal write accesses, and the delayed write signal DWRT, which becomes active for Delayed Write Mode write accesses, allows both conditions to generate an internal write access WRITE, which is active when one of those signals is active. That arrangement allows to delay the generated signal WRITE by a programmable number of cycles of the clock CLK with respect to T0 making up the delay TD. The channel 40AC then starts reading the data signal DATA applied onto the channel board bus 110A.

It is to be understood that in order to avoid synchronization problems, the delay time TD needs to be synchronized with the internal delay time TS to ensure that the valid data signal DATA can be read from the channel 40AC. If the transmission has to go over the system bus 60, the additional delay of transporting the data from one channel board bus to another can be accounted for by changing the programmed delay value accordingly.

It is clear that the implementation of the Delayed Write Mode is not limited to embodiment of FIG. 4. Other logical elements can be used and connected accordingly in order to fulfil the requirements for realizing a delayable signal WRITE for the channel to receive the requested data DATA. An example for a test application is given the following. Before a test execution, the main computer 20 stores programs and test vectors into respective ones of the channel memories 50AA, ..., 50ZZ of the individual channels 40AA, ..., 40ZZ within the channel boards 100A, ..., 100Z. The download speed is determined by the bandwidth of the connection between the main computer and the controller 70. The controller 70 is connected with the channel boards 100A, ..., 100Z through the (high speed) system bus 60 and channel board busses 110A, ..., 100Z. The controller 70 is the only system busmaster.

When a SCAN test is to be executed, the vectors are sequentially downloaded, e.g. from data storage 30, into respective ones of the individual channels 40AA, ..., 40ZZ. In this example, channel 40AZ should be the channel driving the SCAN vectors into the DUT, so that in most applications, channel 40AZ requires the most data of all other channels, whereby the required amount of data is generally more than memory size is available in channel 40AZ. However, other ones of the channels might not need their entire memory capacity for storing data required for the testing. According to the invention, the main computer 20 therefore distributes data required for the channel 40AZ to available memory space in other channels. As an example, the main computer distributes data required for the channel 40AZ (also) to the memory of channel 40AA.

When the test execution is started and the channel memory of channel 40AZ becomes empty, the test is interrupted and the controller 70 becomes active. The controller 70 puts the channel 40AZ, or e.g. a bus interface thereof, into the "Delayed Write Mode". Then the channel memory of channel 40AA is read by the controller 70. The read transactions from the channel 40AA on the system bus 60 and the channel board bus 110A are treated by the channel 40AZ as write transactions. Hence data from channel 40AA is transferred to channel 40AZ at high speed without significant additional complexity inside the channels or on the channel boards.

The invention is particularly efficient for multi site SCAN testing. If the sources and destinations of the SCAN vectors are respectively located on the same channel boards, all copy operations can occur simultaneously.

It is clear that the loading and reloading of the memories can be executed for a plurality of individuals channel-memories of the individual channels 40AA, ..., 40ZZ substantially in parallel. However, the distributing of data is preferably executed separately within the channels of respective channel boards 100A, ..., 100Z over the respective one of the channel board busses 110A, ..., 110Z.

What is claimed is:

1. A method for loading data into a channel memory of one of a plurality of individual channels in a computer system having a multi-channel architecture, wherein the plurality of individual channels have respective channel memories and are connected by a bus, the method comprising the steps of:

(a) loading data into a channel memory to be loaded;

(b) distributing further data which is to be loaded into the channel memory to be loaded, into another channel memory of another one of the plurality of individual channels; and (c) reloading the data from the channel memory of the other one of the plurality of individual channels to the channel memory to be loaded via the bus said step of reloading further comprising the steps of:

(c1) instructing the channel memory to be loaded to treat read transactions on the bus as write transactions; and (c2) starting a read transaction on the bus by reading the data to be loaded into the channel memory from the channel memory of another one of the plurality of individual channels, whereby the channel memory to be loaded treats the read transaction as a write transaction and stores the data applied on the bus.

2. The method according to claim 1, where in the start of the storing of the data applied on the bus it delayed with respect to start of the read transaction.

3. A multi-channel architecture comprising a main computer for controlling the multi-channel architecture, a plurality of individual channels, each with a respective channel memory, and a system bus for connecting the plurality of individual channels and the main computer; the multi-channel architecture further comprising:

means for loading data into a channel memory to be loaded;

means for distributing further data which is to be loaded into the channel memory to be loaded to another channel memory of another one of the plurality of individual channels;

means for reloading the data from the channel memory of the another one of the plurality of individual channels to the channel memory to be loaded via the bus;

means for instructing the channel memory to be loaded to treat read transactions on the bus as write transactions;

means for starting a read transaction on the bus for applying a certain data to be loaded into the channel memory from the channel memory of another one of the plurality of individual channels on the bus;

means for treating the read transaction as a write transaction and for storing the data applied on the bus; and means for delaying the start of the storing of the data applied on the bus with respect to start of the read transaction.

* * * * *